US012300520B2

(12) United States Patent
Kohaku et al.

(10) Patent No.: US 12,300,520 B2
(45) Date of Patent: May 13, 2025

(54) SUBFAB AREA INSTALLATION APPARATUS

(71) Applicants: EBARA CORPORATION, Tokyo (JP); EBARA REFRIGERATION EQUIPMENT & SYSTEMS CO., LTD., Tokyo (JP)

(72) Inventors: Motoshi Kohaku, Tokyo (JP); Yukihiro Fukusumi, Tokyo (JP); Nobutaka Bannai, Tokyo (JP); Hiromasa Miyata, Tokyo (JP); Naoya Hanafusa, Tokyo (JP); Ken Taoka, Tokyo (JP); Kazutomo Miyazaki, Tokyo (JP)

(73) Assignees: EBARA CORPORATION, Tokyo (JP); EBARA REFRIGERATION EQUIPMENT & SYSTEMS CO., LTD., Tokyo (JP)

( * ) Notice: Subject to any disclaimer, the term of this patent is extended or adjusted under 35 U.S.C. 154(b) by 344 days.

(21) Appl. No.: 17/746,279

(22) Filed: May 17, 2022

(65) Prior Publication Data

US 2022/0375771 A1 Nov. 24, 2022

(30) Foreign Application Priority Data

May 24, 2021 (JP) .................. 2021-086745

(51) Int. Cl.
*H01L 21/67* (2006.01)
*C23C 16/44* (2006.01)
(Continued)

(52) U.S. Cl.
CPC .... *H01L 21/67109* (2013.01); *C23C 16/4412* (2013.01); *F25B 25/005* (2013.01);
(Continued)

(58) Field of Classification Search
CPC ........ H01L 21/67109; H01L 21/67023; G23C 16/4412; F25B 25/005; F25B 49/02; F25B 2400/24; C23C 16/4412
See application file for complete search history.

(56) References Cited

U.S. PATENT DOCUMENTS

2003/0015294 A1* 1/2003 Wang ................ H01L 21/67109
156/345.52
2003/0126872 A1* 7/2003 Harano ................. F25B 25/005
62/185

(Continued)

FOREIGN PATENT DOCUMENTS

JP 2001-082771 A 3/2001
JP 2006-313048 A 11/2006
(Continued)

OTHER PUBLICATIONS

Lee et al., Chiller Apparatus for Semiconductor Processing Equipment, Jun. 1, 2009, KR20090054597A, Whole Document (Year: 2009).*

*Primary Examiner* — Larry L Furdge
(74) *Attorney, Agent, or Firm* — Leydig, Voit & Mayer, Ltd.

(57) ABSTRACT

A sub-fab area installation apparatus includes: a vacuum pump configured to evacuate a processing gas from a processing chamber of the semiconductor manufacturing equipment; a cooling unit configured to cool a first circulation liquid used in the processing chamber; a heating unit configured to heat a second circulation liquid used in the processing chamber; and a cooling-liquid line configured to pass a cooling liquid therethrough. The cooling liquid is supplied from a cooling source. The cooling-liquid line includes: a distribution line configured to supply the cooling liquid to the vacuum pump and the cooling unit; and a merging return line configured to merge the cooling liquid (Continued)

that has passed through the vacuum pump and the cooling unit and return the cooling liquid to the cooling source.

18 Claims, 8 Drawing Sheets

(51) Int. Cl.
 *F25B 25/00* (2006.01)
 *F25B 49/02* (2006.01)
(52) U.S. Cl.
 CPC ........ *F25B 49/02* (2013.01); *H01L 21/67023* (2013.01); *F25B 2400/24* (2013.01)

(56) References Cited

U.S. PATENT DOCUMENTS

| | | |
|---|---|---|
| 2013/0240144 A1 | 9/2013 | Buchberger et al. |
| 2017/0092471 A1 * | 3/2017 | Wakai ............... H01L 21/67248 |

FOREIGN PATENT DOCUMENTS

| | | |
|---|---|---|
| JP | 2014-231822 A | 12/2014 |
| JP | 2017-063088 A | 3/2017 |
| JP | 2019-117231 A | 7/2019 |
| JP | 2019-174050 A | 10/2019 |
| KR | 20090054597 A * | 10/2009 |
| WO | WO 2002/067301 A1 | 8/2002 |

* cited by examiner

SUBFAB AREA INSTALLATION APPARATUS

CROSS REFERENCE TO RELATED APPLICATION

This document claims priority to Japanese Patent Application No. 2021-086745 filed May 24, 2021, the entire contents of which are hereby incorporated by reference.

BACKGROUND

An etching equipment, arranged in a clean room, is used for a dry etching process which is one of semiconductor manufacturing processes. In a sub-fab area under a floor of the etching equipment, there are disposed several devices including an abatement device for detoxifying a processing gas used for etching, a vacuum pump for evacuating the processing gas from an etching chamber, and a cooling unit for cooling a circulation liquid flowing through the etching chamber, and a heating unit for heating the circulation liquid flowing through the etching chamber. Heating types of the heating unit include a type of heating the circulation liquid with a hot gas of a compression-type refrigeration machine, a type of heating the circulation liquid with an electric heater, and a type of heating the circulation liquid with both the hot gas and the heater. The abatement device, the vacuum pump, the cooling unit, and the heating unit are required to be cooled with cooling water (it is noted that the heating unit of electric heater type does not require the cooling water).

International patent publication No. WO 2002/067301 discloses an exhaust-heat utilization system that uses hot cooling water at 80° C. from a vertical heat-treatment equipment (i.e., a semiconductor-wafer heat treatment equipment) of a semiconductor manufacturing equipment as a heating source of an etching equipment.

Japanese laid-open patent publication No. 2019-174050 discloses an exhaust-heat recovery and reuse system that absorbs and uses exhaust heat from an abatement device with a heat pump. The exhaust gas is used as a heating source for a resin tower that purifies raw water in a water treatment facility in a semiconductor manufacturing facility and a reverse osmosis membrane equipment.

Japanese laid-open patent publication No. 2014-231822 discloses a system in which a vacuum pump is integrated with an abatement unit to share cooling water.

Japanese laid-open patent publication No. 2006-313048 discloses an exhaust-heat utilization system in which a plurality of exhaust heat generating devices and a plurality of exhaust heat utilization devices are coupled by exhaust heat transfer paths.

As the number of etching equipment increases, the devices in the sub-fab area also increase. Since these devices are operated individually without transferring heat between these devices and are not optimized for the entire devices in the sub-fab area, the power consumption increases as the number of devices increases.

A possible way of effectively utilizing the heat is to drive a heat pump using the cooling water whose temperature has risen after being used for cooling the abatement device, the dry pump, and the cooling unit. However, these devices are designed individually, and therefore it is difficult to further promote the effective use of the heat. In addition, when the devices are to be installed, pipe connection between these devices becomes complicated.

SUMMARY

Therefore, there is provided a sub-fab area installation apparatus capable of promoting cooperation of heat utilization between devices in a sub-fab area and eliminating complexity of pipe connection for installing the devices.

Embodiments, which will be described below, relate to a sub-fab area installation apparatus used for a semiconductor manufacturing equipment, such as an etching equipment, and more particularly to a sub-fab installation apparatus for cooling and heating a circulation liquid used in a semiconductor manufacturing equipment.

In an embodiment, there is provided a sub-fab area installation apparatus used for a semiconductor manufacturing equipment, comprising: a vacuum pump configured to evacuate a processing gas from a processing chamber of the semiconductor manufacturing equipment; a cooling unit configured to cool a first circulation liquid used in the processing chamber; a heating unit configured to heat a second circulation liquid used in the processing chamber; and a cooling-liquid line configured to pass a cooling liquid therethrough, the cooling liquid being supplied from a cooling source, wherein the cooling unit includes a first heat pump through which a refrigerant circulates, the heating unit includes a second heat pump through which a refrigerant circulates, and the cooling-liquid line includes: a distribution line configured to supply the cooling liquid to the vacuum pump and the cooling unit; and a merging return line configured to merge the cooling liquid that has passed through the vacuum pump and the cooling unit and return the cooling liquid to the cooling source.

According to the above-described embodiment, the vacuum pump and the cooling unit are coupled by the distribution line and the merging return line. Therefore, it is not necessary to provide a supply line and a discharge line for the cooling liquid for each of the vacuum pump and the cooling unit. Therefore, costs of pipes and manufacturing costs associated with pipe connection at the installation site can be reduced, and as a result, manufacturing costs of the sub-fab area installation apparatus can be reduced.

In an embodiment, the cooling-liquid line further includes a collecting line configured to supply the cooling liquid that has passed through the vacuum pump and the cooling unit to the heating unit.

According to the above-described embodiment, the vacuum pump and the cooling unit are coupled by the distribution line, the merging return line, and the collecting line. Therefore, it is not necessary to provide a supply line and a discharge line for the cooling liquid for each of the vacuum pump and the cooling unit. Therefore, costs of pipes and manufacturing costs associated with pipe connection at the installation site can be reduced, and as a result, manufacturing costs of the sub-fab area installation apparatus can be reduced.

In an embodiment, the sub-fab area installation apparatus further comprises a supercooling device configured to perform heat exchange between the cooling liquid that has passed through the heating unit and the refrigerant that flows from a condenser to an evaporator of the first heat pump.

According to the above-described embodiment, the refrigerant is supercooled by the cooling liquid, so that the cooling efficiency of the cooling unit can be improved.

In an embodiment, the sub-fab area installation apparatus further comprises a circulation-liquid cooler configured to perform heat exchange between the second circulation liquid and the cooling liquid flowing through the collecting line.

According to the above-described embodiment, the second circulation liquid is cooled by the cooling liquid flowing through the collecting line, and the temperature of the second circulation liquid when it is excessively heated can be appropriately regulated.

In an embodiment, the cooling-liquid line further comprises a communication line configured to deliver the cooling liquid that has passed through the circulation-liquid cooler to the collecting line.

According to the above-described embodiment, since the cooling liquid that has passed through the circulation-liquid cooler has a higher temperature, the heating efficiency of the heating unit can be improved by delivering the cooling liquid to the heating unit through the collecting line.

In an embodiment, the sub-fab area installation apparatus further comprises an external supply line configured to supply a cooling liquid, heated by an external heat source, to the heating unit.

According to the above-described embodiment, since the cooling liquid heated by the external heat source has a higher temperature, the heating efficiency of the heating unit can be improved by delivering the cooling liquid to the heating unit through the external supply line.

In an embodiment, there is provided a sub-fab area installation apparatus used for a semiconductor manufacturing equipment, comprising: a vacuum pump configured to evacuate a processing gas from a processing chamber of the semiconductor manufacturing equipment; a cooling unit configured to cool a first circulation liquid used in the processing chamber; a heating unit configured to heat a second circulation liquid used in the processing chamber; a cooling-liquid line configured to pass a cooling liquid therethrough, the cooling liquid being supplied from a cooling source; and a refrigerant supply line, wherein the cooling unit includes a first heat pump through which a refrigerant circulates, the heating unit includes a second heat pump through which a refrigerant circulates, and the refrigerant supply line is configured to supply a part of the refrigerant, as a cooling medium, which has passed through an evaporator of the first heat pump to the vacuum pump.

According to the above-described embodiment, since the vacuum pump can be cooled by using the refrigerant of the first heat pump, it is not necessary to introduce the cooling liquid to the vacuum pump. As a result, the pipes for the cooling liquid can be simplified.

In an embodiment, the cooling-liquid line includes: an upstream line configured to supply the cooling liquid to the cooling unit; and a downstream line configured to supply the cooling liquid that has passed through the cooling unit to the heating unit.

In an embodiment, the sub-fab area installation apparatus further comprises a supercooling device configured to perform heat exchange between the cooling liquid that has passed through the heating unit and the refrigerant that flows from a condenser to an evaporator of the first heat pump.

According to the above-described embodiment, the refrigerant is supercooled by the cooling liquid, so that the cooling efficiency of the cooling unit can be improved.

In an embodiment, the sub-fab area installation apparatus further comprises a circulation-liquid cooler configured to perform heat exchange between the second circulation liquid and the cooling liquid that has passed through the cooling unit.

According to the above-described embodiment, the second circulation liquid is cooled by the cooling liquid that has passed through the cooling unit, and the temperature of the second circulation liquid when it is excessively heated can be appropriately regulated.

In an embodiment, the cooling-liquid line further comprises a communication line configured to deliver the cooling liquid that has passed through the circulation-liquid cooler to the downstream line.

According to the above-described embodiment, since the cooling liquid that has passed through the circulation-liquid cooler has a higher temperature, the heating efficiency of the heating unit can be improved by introducing the cooling liquid to the heating unit through the downstream line.

In an embodiment, the sub-fab area installation apparatus further comprises an external supply line configured to supply a cooling liquid, heated by an external heat source, to the heating unit.

According to the above-described embodiment, since the cooling liquid heated by the external heat source has a higher temperature, the heating efficiency of the heating unit can be improved by delivering the cooling liquid to the heating unit through the external supply line.

According to the above-described embodiments, costs of pipes and manufacturing costs associated with pipe connection at the installation site can be reduced, and as a result, manufacturing costs of the sub-fab area installation apparatus can be reduced. Further, the cooling efficiency of the cooling unit can be improved, the temperature controllability of the second circulation liquid in the heating unit can be improved, and the heating efficiency of the heating unit can be improved.

DESCRIPTION OF EMBODIMENTS

Hereinafter, embodiments will be described with reference to the drawings.

Figure 1:
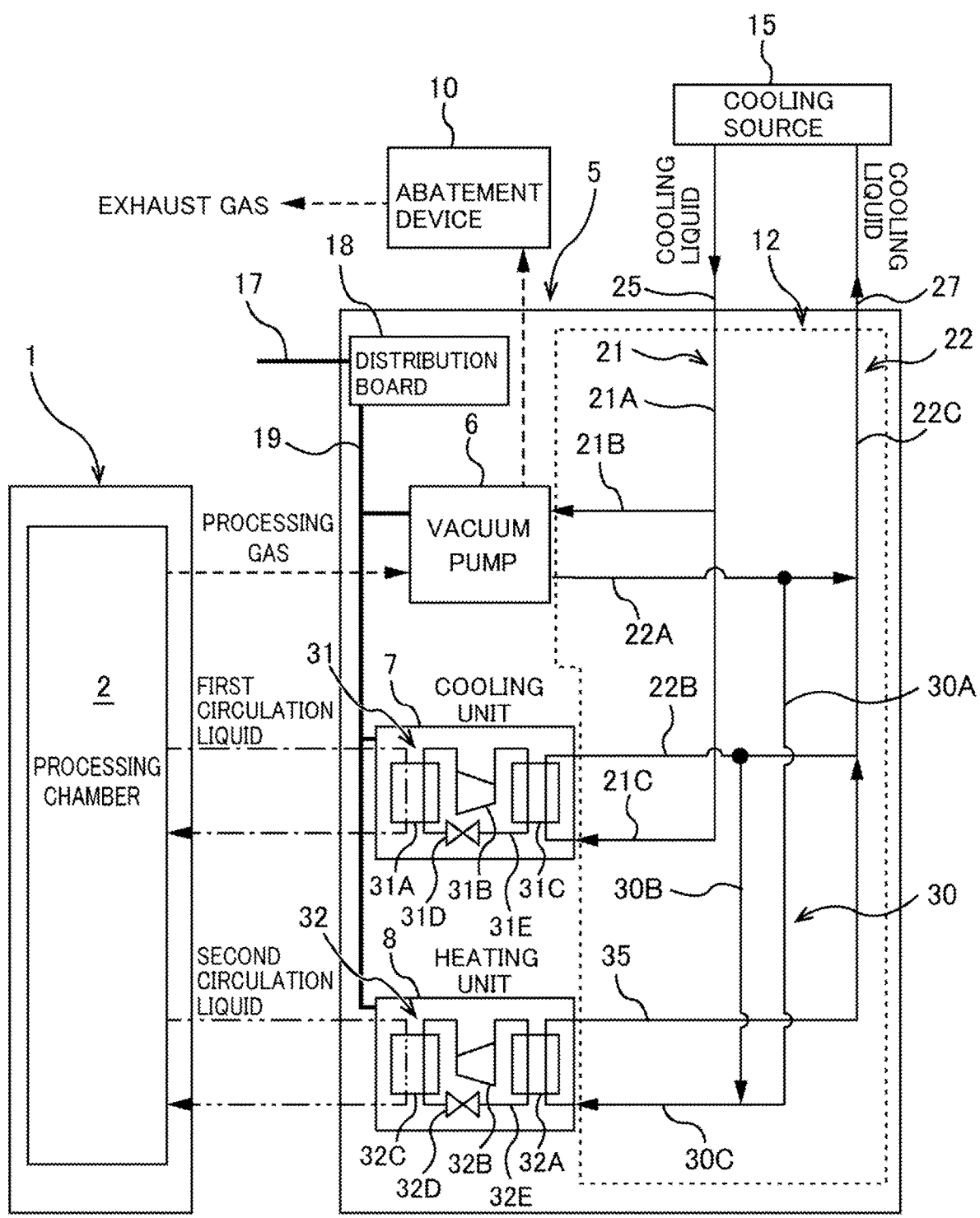
FIG. 1 is a schematic diagram showing an embodiment of a semiconductor manufacturing equipment and a sub-fab area installation apparatus.

FIG. 1 is a schematic diagram showing an embodiment of a semiconductor manufacturing equipment and a sub-fab area installation apparatus. A semiconductor manufacturing equipment 1 in the embodiment shown in FIG. 1 is an etching equipment including a processing chamber 2. A sub-fab area installation apparatus 5 is arranged in the sub-fab area under a floor on which the semiconductor manufacturing equipment 1 is disposed. The sub-fab area installation apparatus 5 is coupled to the processing chamber 2, so that a first circulation liquid and a second circulation liquid circulate between the processing chamber 2 and the sub-fab area installation apparatus 5.

The sub-fab area installation apparatus 5 includes a vacuum pump 6 for evacuating a processing gas (for example, an etching gas) from the processing chamber 2, a cooling unit 7 for cooling the first circulation liquid that has been used in the processing chamber 2, a heating unit 8 for heating the second circulation liquid that has been used in the processing chamber 2, and a cooling-liquid line 12 through which a cooling liquid, supplied from a cooling source 15, flows. The vacuum pump 6, the cooling unit 7, and the heating unit 8 are coupled to the processing chamber 2.

The sub-fab area installation apparatus 5 further includes a distribution board 18 coupled to a power cable 17, and a power distribution cable 19 electrically coupled to the distribution board 18. The distribution board 18 is electrically coupled to the vacuum pump 6, the cooling unit 7, and the heating unit 8 by the power distribution cable 19. Electric power is delivered from a power source (not shown) to the distribution board 18 through the power cable 17, and further supplied from the distribution board 18 to the vacuum pump 6, the cooling unit 7, and the heating unit 8 through the power distribution cable 19. Since the power distribution cable 19 is coupled to the vacuum pump 6, the cooling unit 7, and the heating unit 8 in advance, it is not necessary to install a power line at an installation location of the sub-fab area installation apparatus 5.

The vacuum pump 6 is further coupled to an abatement device 10. The processing gas discharged from the vacuum pump 6 is sent to the abatement device 10 and is abated (or rendered harmless) by the abatement device 10. A suction port of the vacuum pump 6 is coupled to the processing chamber 2, and an exhaust port of the vacuum pump 6 is coupled to the abatement device 10. The type of the vacuum pump 6 is not particularly limited, and examples of the vacuum pump 6 include a positive displacement dry vacuum pump. Examples of the abatement device 10 include a wet abatement device, a catalytic abatement device, a combustion abatement device, a heater abatement device, and a plasma abatement device.

The cooling liquid is supplied to the vacuum pump 6 and the cooling unit 7 from the cooling source 15 through the cooling-liquid line 12. The cooling source 15 may be a chiller provided in a factory where the semiconductor manufacturing equipment 1 is installed. The cooling-liquid line 12 includes a distribution line 21 configured to supply the cooling liquid to the vacuum pump 6 and the cooling unit 7, and a merging return line 22 configured to merge the cooling liquid that has passed through the vacuum pump 6 and the cooling unit 7 and return the cooling liquid to the cooling source 15.

The distribution line 21 extends from a cooling-liquid inlet 25 to the vacuum pump 6 and the cooling unit 7. More specifically, the distribution line 21 includes a main supply line 21A having the cooling-liquid inlet 25, and a first branch line 21B and a second branch line 21C branching off from the main supply line 21A. One end of the first branch line 21B is coupled to the main supply line 21A, and other end of the first branch line 21B is coupled to the vacuum pump 6. One end of the second branch line 21C is coupled to the main supply line 21A, and other end of the second branch line 21C is coupled to the cooling unit 7. The cooling-liquid inlet 25 communicates with the cooling source 15. The cooling liquid supplied from the cooling source 15 flows through the cooling-liquid inlet 25 into the main supply line 21A, flows through the main supply line 21A, and is divided into the first branch line 21B and the second branch line 21C. The cooling liquid is further supplied to the vacuum pump 6 through the first branch line 21B to cool the vacuum pump 6, and is supplied to the cooling unit 7 through the second branch line 21C to cool the cooling unit 7.

The merging return line 22 extends from the vacuum pump 6 and the cooling unit 7 to a cooling liquid outlet 27. More specifically, the merging return line 22 includes a first return line 22A coupled to the vacuum pump 6, a second return line 22B coupled to the cooling unit 7, and a main return line 22C coupled to the first return line 22A and the second return line 22B. The main return line 22C has the cooling liquid outlet 27, and the cooling liquid outlet 27 communicates with the cooling source 15. One end of the first return line 22A is coupled to the vacuum pump 6, and other end of the first return line 22A is coupled to the main return line 22C. One end of the second return line 22B is coupled to the cooling unit 7, and other end of the second return line 22B is coupled to the main return line 22C. The cooling liquid heated by passing through the vacuum pump 6 and the cooling unit 7 flows through the first return line 22A and the second return line 22B, joins in the main return line 22C, and further flows through the main return line 22C and is returned to the cooling source 15.

As described above, according to the present embodiment, the vacuum pump 6 and the cooling unit 7 are coupled by the distribution line 21 and the merging return line 22. Therefore, it is not necessary to provide a supply line and a discharge line for the cooling liquid for each of the vacuum pump 6 and the cooling unit 7. Therefore, costs of pipes and manufacturing costs associated with pipe connection at the installation site can be reduced, and as a result, manufacturing costs of the sub-fab area installation apparatus can be reduced.

The cooling-liquid line 12 further includes a collecting line 30 configured to supply the cooling liquid that has passed through the vacuum pump 6 and the cooling unit 7 to the heating unit 8. The collecting line 30 extends from the vacuum pump 6 and the cooling unit 7 to the heating unit 8. More specifically, the collecting line 30 includes a first transfer line 30A coupled to the vacuum pump 6, a second transfer line 30B coupled to the cooling unit 7, and a main transfer line 30C coupled to the first transfer line 30A, the second transfer line 30B, and the heating unit 8.

One end of the first transfer line 30A is coupled to the first return line 22A, and other end of the first transfer line 30A is coupled to the main transfer line 30C. The first transfer line 30A is coupled to the vacuum pump 6 via a part of the first return line 22A. Specifically, a part of the first return line 22A also serves as a part of the first transfer line 30A. In one embodiment, one end of the first transfer line 30A may be coupled to the vacuum pump 6, one end of the first return line 22A may be coupled to the first transfer line 30A, and a part of the first transfer line 30A may serve as a part of the first return line 22A.

One end of the second transfer line 30B is coupled to the second return line 22B, and other end of the second transfer line 30B is coupled to the main transfer line 30C. The second transfer line 30B is coupled to the cooling unit 7 via a part of the second return line 22B. Specifically, a part of the second return line 22B also serves as a part of the second transfer line 30B. In one embodiment, one end of the second transfer line 30B may be coupled to the cooling unit 7, one end of the second return line 22B may be coupled to the second transfer line 30B, and a part of the second transfer line 30B may serve as a part of the second return line 22B. Further, in one embodiment, the second transfer line 30B and the second return line 22B may be two independent lines.

A part of the cooling liquid heated by passing through the vacuum pump 6 and the cooling unit 7 flows through the first transfer line 30A and the second transfer line 30B and joins in the main transfer line 30C, and further flows through the main transfer line 30C into the heating unit 8.

According to the present embodiment, the vacuum pump 6 and the cooling unit 7 are coupled by the distribution line 21, the merging return line 22, and the collecting line 30. Therefore, it is not necessary to provide a supply line and a discharge line for the cooling liquid for each of the vacuum pump 6 and the cooling unit 7. Therefore, costs of pipes and manufacturing costs associated with pipe connection at the installation site can be reduced, and as a result, manufacturing costs of the sub-fab area installation apparatus can be reduced.

The cooling unit 7 includes a first heat pump 31 in which a refrigerant circulates. The first heat pump 31 is a refrigeration machine (for example, a vapor compression refrigeration machine). Specifically, the first heat pump 31 includes a first evaporator 31A configured to evaporate a refrigerant liquid to produce a refrigerant gas, a first compressor 31B configured to compress the refrigerant gas, a first condenser 31C configured to condense the compressed refrigerant gas to produce the refrigerant liquid, and a first expansion valve 31D arranged between the first evaporator 31A and the first condenser 31C. The refrigerant flows through a first refrigerant pipe 31E to circulate through the first evaporator 31A, the first compressor 31B, the first condenser 31C, and the first expansion valve 31D. The processing chamber 2 is coupled to the first evaporator 31A, and the first circulation liquid circulates between the processing chamber 2 and the first evaporator 31A.

The second branch line 21C of the distribution line 21, the second return line 22B of the merging return line 22, and the second transfer line 30B of the collecting line 30 are coupled to the first condenser 31C. The cooling liquid supplied from the cooling source 15 is delivered into the first condenser 31C through the second branch line 21C of the distribution line 21 and exchanges heat with the refrigerant gas in the first condenser 31C. As a result of the heat exchange between the cooling liquid and the refrigerant gas, the cooling liquid is heated, while the refrigerant gas is cooled into the refrigerant liquid. The refrigerant liquid is delivered to the first evaporator 31A via the first expansion valve 31D. The first circulation liquid is delivered to the first evaporator 31A and exchanges heat with the refrigerant liquid in the first evaporator 31A. As a result of heat exchange between the first circulation liquid and the refrigerant liquid, the first circulation liquid is cooled, while the refrigerant liquid is heated into the refrigerant gas. The refrigerant gas is sucked into the first compressor 31B and compressed by the first compressor 31B. The compressed refrigerant gas is delivered to the first condenser 31C. In this way, the first circulation liquid is cooled by the cooling liquid via the refrigerant. A part of the cooling liquid that has passed through the first condenser 31C is returned to the cooling source 15 through the merging return line 22, and the rest of the cooling liquid is sent to the heating unit 8 through the collecting line 30.

The heating unit 8 includes a second heat pump 32 in which the refrigerant circulates. The second heat pump 32 is a refrigeration machine (for example, a vapor compression refrigeration machine). Specifically, the second heat pump 32 includes a second evaporator 32A configured to evaporate a refrigerant liquid to produce a refrigerant gas, a second compressor 32B configured to compress the refrigerant gas, a second condenser 32C configured to condense the compressed refrigerant gas to produce the refrigerant liquid, and a second expansion valve 32D arranged between the second evaporator 32A and the second condenser 32C. The refrigerant flows through a second refrigerant pipe 32E to circulate through the second evaporator 32A, the second compressor 32B, the second condenser 32C, and the second expansion valve 32D. The processing chamber 2 is coupled to the second condenser 32C, and the second circulation liquid circulates between the processing chamber 2 and the second condenser 32C.

The main transfer line 30C of the collecting line 30 is coupled to the second evaporator 32A. The cooling liquid whose temperature has risen by passing through the vacuum pump 6 and the cooling unit 7 is delivered into the second evaporator 32A through the collecting line 30 and exchanges heat with the refrigerant liquid in the second evaporator 32A. As a result of the heat exchange between the cooling liquid and the refrigerant liquid, the cooling liquid is cooled, while the refrigerant liquid is heated into the refrigerant gas. The refrigerant gas is sucked into the second compressor 32B and compressed by the second compressor 32B. The compressed refrigerant gas is delivered to the second condenser 32C. The cooling liquid that has passed through the second evaporator 32A is returned to the cooling source 15 through a cooling-liquid return line 35. The second circulation liquid is delivered to the second condenser 32C and exchanges heat with the refrigerant gas in the second condenser 32C. As a result of the heat exchange between the second circulation liquid and the refrigerant gas, the second circulation liquid is heated, while the refrigerant gas is cooled into the refrigerant liquid. The refrigerant liquid is delivered to the second evaporator 32A through the second expansion valve 32D. In this way, the second circulation liquid is heated by the cooling liquid via the refrigerant.

The cooling-liquid line 12 further includes the cooling-liquid return line 35 configured to return the cooling liquid that has passed through the heating unit 8 to the cooling source 15. One end of the cooling-liquid return line 35 is coupled to the second evaporator 32A of the second heat pump 32, and other end of the cooling-liquid return line 35 is coupled to the merging return line 22. In one embodiment, the cooling-liquid return line 35 may be a line independent of the merging return line 22. For example, the cooling-liquid return line 35 may be an independent line extending from the second evaporator 32A of the second heat pump 32 to the cooling liquid outlet 27.

According to the present embodiment, the cooling liquid that has been heated when passing through the vacuum pump 6 and the cooling unit 7 can be used as a heat source in the heating unit 8. Therefore, an electric equipment, such as an electric heater, is unnecessary, or a capacity of an electric equipment can be reduced. Further, the cooling liquid that has been cooled when passing through the heating unit 8 is returned to the cooling source 15, so that the cooling source 15 (for example, a chiller installed in the factory of the semiconductor manufacturing equipment 1) requires less power for cooling the cooling liquid again. As a result, the power consumption used in manufacturing semiconductors can be reduced.

Figure 2:
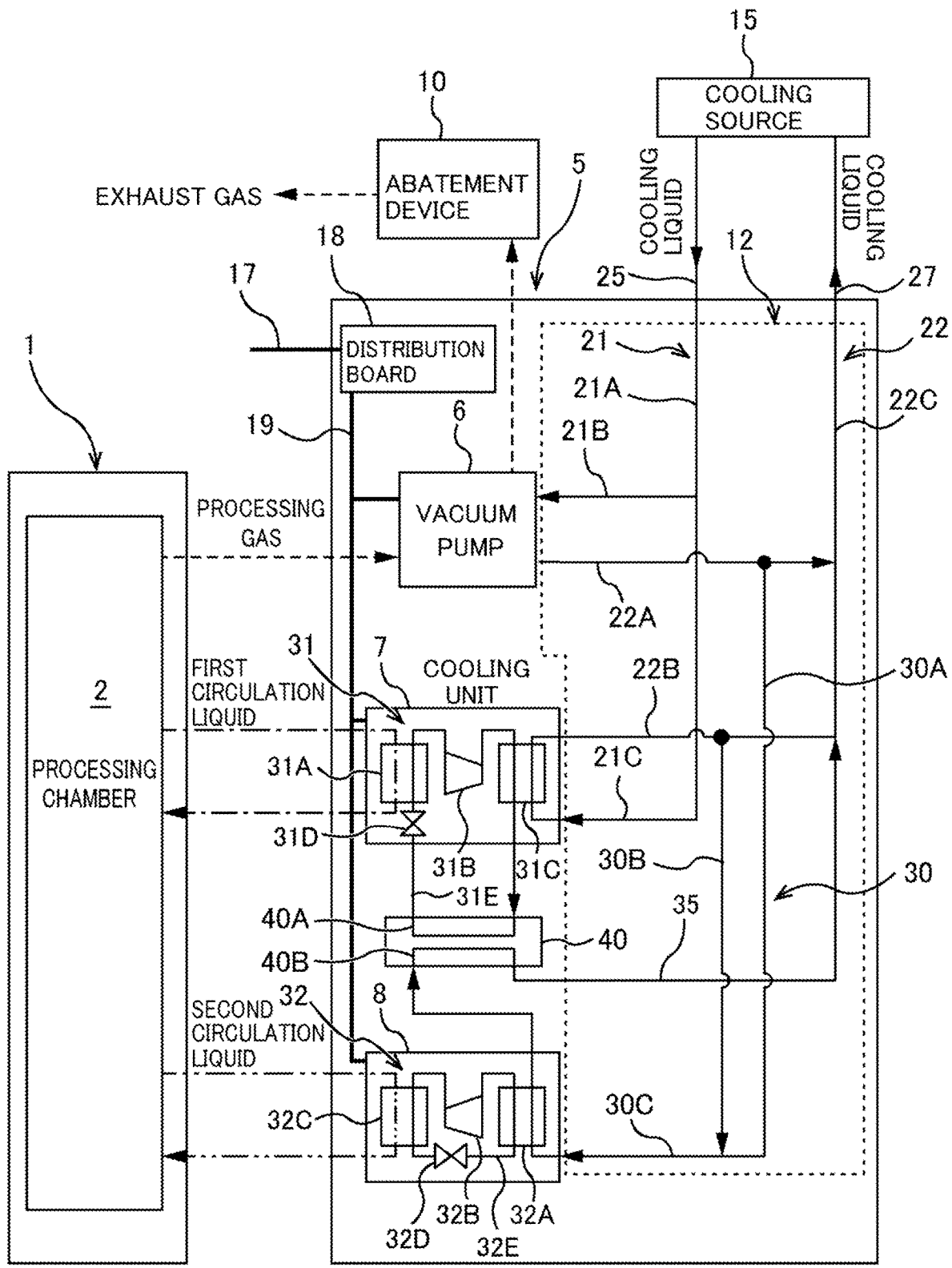
FIG. 2 is a schematic diagram showing another embodiment of the sub-fab area installation apparatus.

FIG. 2 is a schematic diagram showing another embodiment of the sub-fab area installation apparatus 5. Configurations and operations of the present embodiment, which will not be particularly described, are the same as those of the embodiments described with reference to FIG. 1, and duplicated descriptions thereof will be omitted. As shown in FIG. 2, the sub-fab area installation apparatus 5 further includes a supercooling device 40 configured to perform heat exchange between the cooling liquid that has passed through the heating unit 8 and the refrigerant that flows from the first condenser 31C to the first evaporator 31A of the first heat pump 31.

The supercooling device 40 includes a refrigerant flow passage 40A coupled to the first refrigerant pipe 31E of the first heat pump 31, and a cooling-liquid flow passage 40B coupled to a cooling liquid outlet of the second evaporator 32A of the second heat pump 32. The refrigerant flow passage 40A and the cooling-liquid flow passage 40B are located close to each other, so that heat exchange is performed between the refrigerant flowing through the refrigerant flow passage 40A and the cooling liquid flowing through the cooling-liquid flow passage 40B. The refrigerant flow passage 40A is coupled to a portion of the first refrigerant pipe 31E extending from the first condenser 31C to the first evaporator 31A. Therefore, the refrigerant discharged from the first condenser 31C flows to the first evaporator 31A via the refrigerant flow passage 40A of the supercooling device 40. The cooling-liquid flow passage 40B is coupled to a part of the cooling-liquid return line 35. Therefore, the cooling-liquid flow passage 40B is coupled to the cooling liquid outlet of the second evaporator 32A via the cooling-liquid return line 35. The cooling liquid that has flowed out of the second evaporator 32A of the second heat pump 32 passes through the cooling-liquid flow passage 40B of the supercooling device 40 on the way through the cooling-liquid return line 35, and exchanges heat with the refrigerant. Then, the cooling liquid that has performed the heat exchange is returned to the cooling source 15 through the cooling-liquid return line 35.

According to the present embodiment, since the refrigerant is supercooled by the cooling liquid, the cooling efficiency of the cooling unit 7 can be improved.

Figure 3:
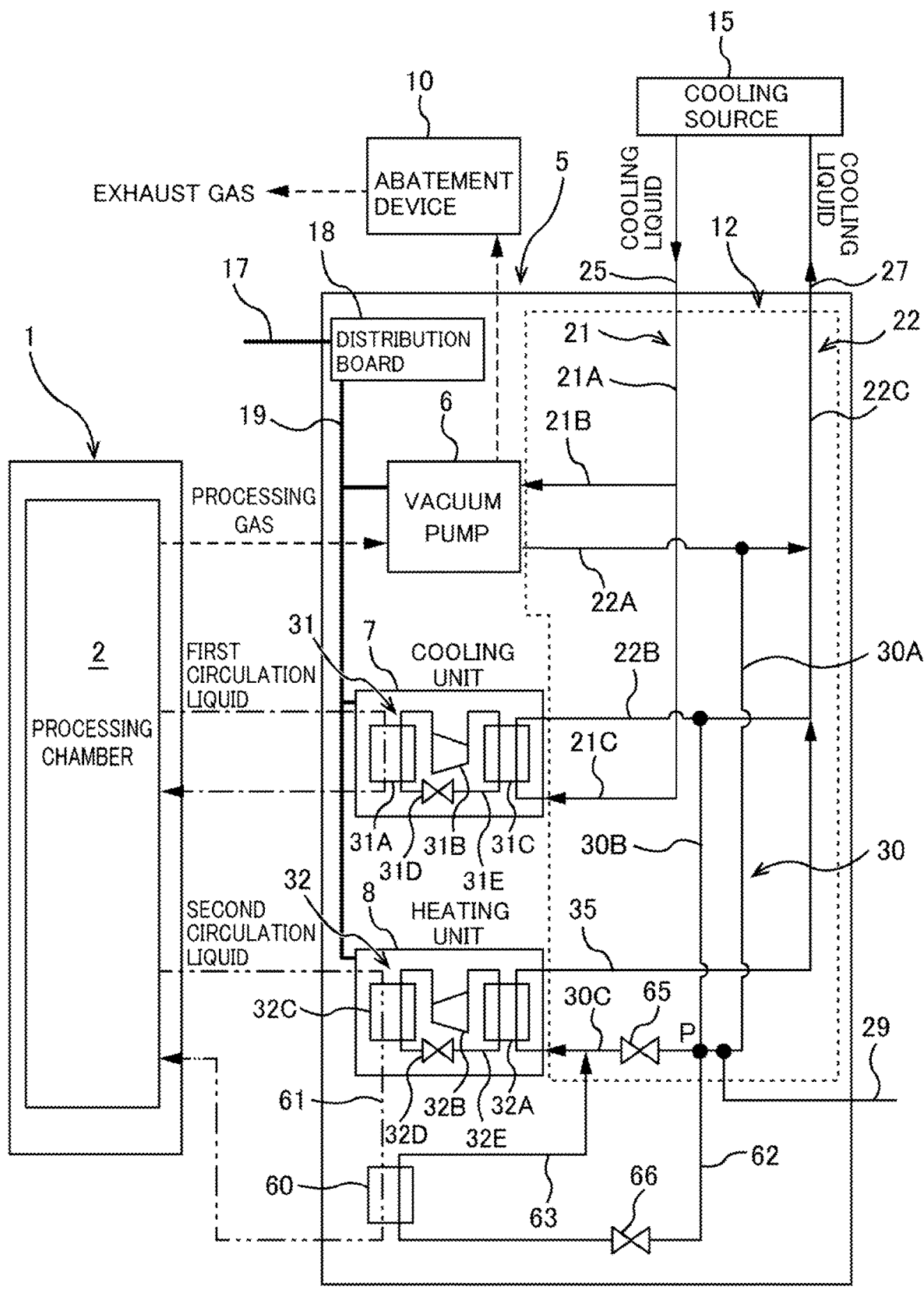
FIG. 3 is a schematic diagram showing still another embodiment of the sub-fab area installation apparatus.

FIG. 3 is a schematic diagram showing still another embodiment of the sub-fab area installation apparatus 5. Configurations and operations of the present embodiment, which will not be particularly described, are the same as those of the embodiments described with reference to FIG. 1, and duplicated descriptions thereof will be omitted. As shown in FIG. 3, the sub-fab area installation apparatus 5 includes a circulation-liquid cooler 60 configured to perform heat exchange between the second circulation liquid and the cooling liquid that has passed through the cooling unit 7. Further, the sub-fab area installation apparatus 5 includes a circulation-liquid introduction line 61 extending from the second condenser 32C of the second heat pump 32 to the circulation-liquid cooler 60. The cooling-liquid line 12 further includes a circulation-liquid cooling line 62 extending from the main transfer line 30C to the circulation-liquid cooler 60, and a communication line 63 extending from the circulation-liquid cooler 60 to the main transfer line 30C. In one embodiment, the communication line 63 may be coupled to the main return line 22C so that the cooling liquid is returned to the cooling source 15.

The cooling liquid flowing through the main transfer line 30C flows into the circulation-liquid cooler 60 via the circulation-liquid cooling line 62, while the second circulation liquid that has passed through the second condenser 32C of the second heat pump 32 flows into the circulation-liquid cooler 60 via the introduction line 61. The cooling liquid and the second circulation liquid exchange heat in the circulation-liquid cooler 60, and the second circulation liquid is cooled by the cooling liquid. The cooled second circulation liquid is returned to the processing chamber 2. According to the present embodiment, the second circulation liquid is cooled by the cooling liquid, and the temperature of the second circulation liquid when it is excessively heated by the heating unit 8 can be appropriately adjusted.

The sub-fab area installation apparatus 5 has a first flow-rate control valve 65 attached to the main transfer line 30C, and a second flow-rate control valve 66 attached to the circulation-liquid cooling line 62. The first flow-rate control valve 65 is located between the cooling unit 7 and a branch point P between the circulation-liquid cooling line 62 and the main transfer line 30C. The second flow-rate control valve 66 may be attached to the communication line 63.

A flow rate of the cooling liquid flowing through the circulation-liquid cooler 60 is determined by the operations of the first flow-rate control valve 65 and the second flow-rate control valve 66. Specifically, when an opening degree of the second flow-rate control valve 66 is lowered and an opening degree of the first flow-rate control valve 65 is increased, the flow rate of the cooling liquid flowing to the heating unit 8 increases, while the flow rate of the cooling liquid flowing to the circulation-liquid cooler 60 decreases. In one example, the opening degree of the second flow-rate control valve 66 is set to 0% (i.e., the second flow-rate control valve 66 is fully closed), and the opening degree of the first flow-rate control valve 65 is set to 100% (i.e., the first flow-rate control valve 65 is fully opened). In this case, the cooling liquid that has passed through the cooling unit 7 flows to the heating unit 8 and does not pass through the circulation-liquid cooler 60.

When the opening degree of the second flow-rate control valve 66 is increased and the opening degree of the first flow-rate control valve 65 is decreased, the flow rate of the cooling liquid flowing to the heating unit 8 decreases, while the flow rate of the cooling liquid flowing to the circulation-liquid cooler 60 increases. In one example, the opening degree of the second flow-rate control valve 66 is set to 100% (i.e., the second flow-rate control valve 66 is fully opened), and the opening degree of the first flow-rate control valve 65 is set to 0% (i.e., the first flow-rate control valve 65 is fully closed). In this case, the flow rate of the cooling liquid flowing through the circulation-liquid cooler 60 is maximized.

In this way, the flow rate of the cooling liquid passing through the circulation-liquid cooler 60 can be regulated by the balance between the opening degrees of the second flow-rate control valve 66 and the first flow rate control panel 65, so that the temperature of the second circulation liquid can be adjusted or regulated appropriately.

The sub-fab area installation apparatus 5 further includes an external supply line 29 configured to supply, to the heating unit 8, a cooling liquid heated by an external heat source to have an increased temperature. Since the cooling liquid heated by the external heat source, such as an abatement device, has a higher temperature, the heating efficiency of the heating unit 8 can be improved by introducing such cooling liquid to the heating unit 8 through the external supply line 29. The external supply line 29 may be coupled to the main transfer line 30C. Further, in one embodiment, the external supply line 29 may be directly coupled to the heating unit 8.

Figure 4:
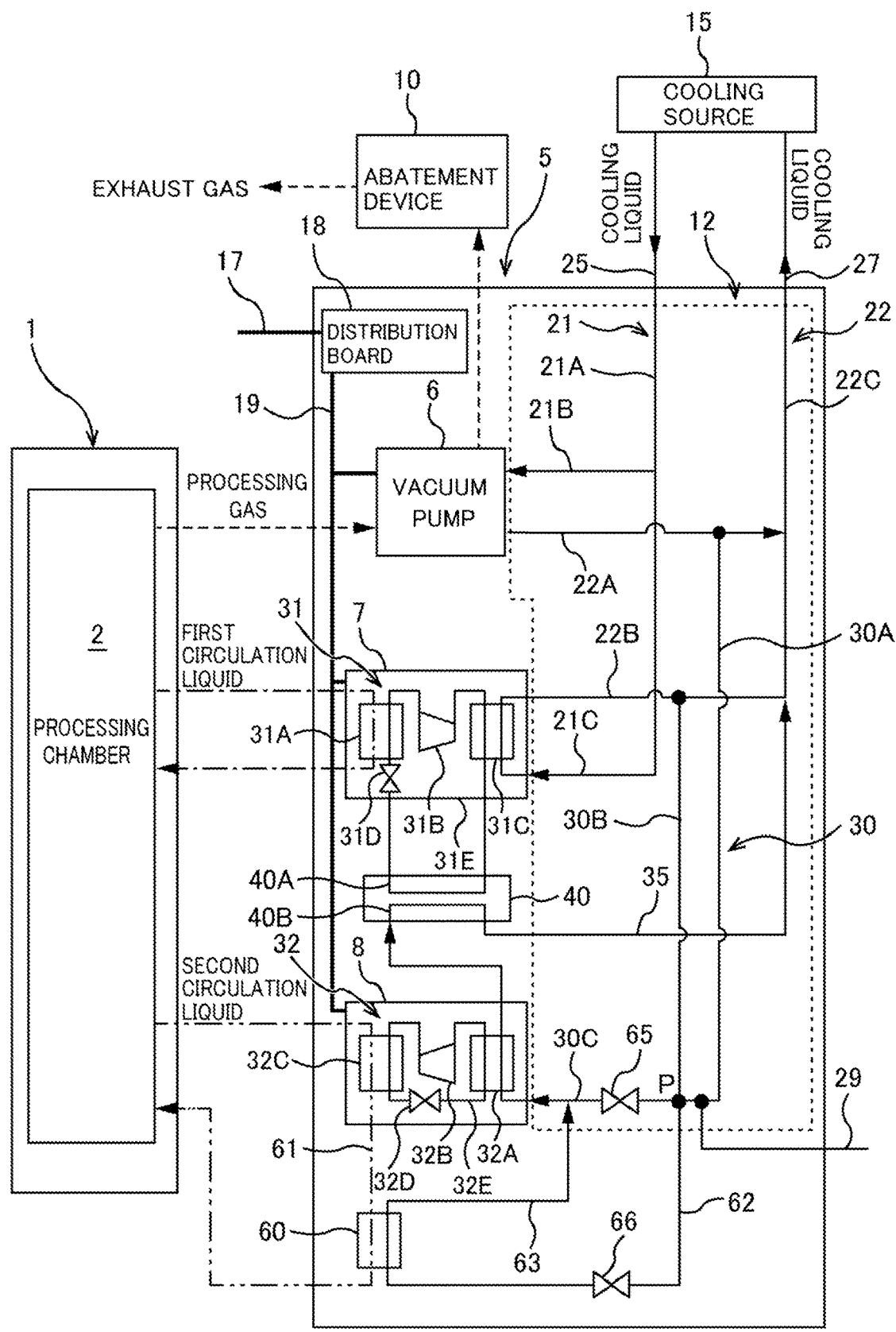
FIG. 4 is a schematic diagram showing still another embodiment of the sub-fab area installation apparatus.

As shown in FIG. 4, the supercooling device 40 described with reference to FIG. 2 may be incorporated into the embodiment described with reference to FIG. 3.

Figure 5:
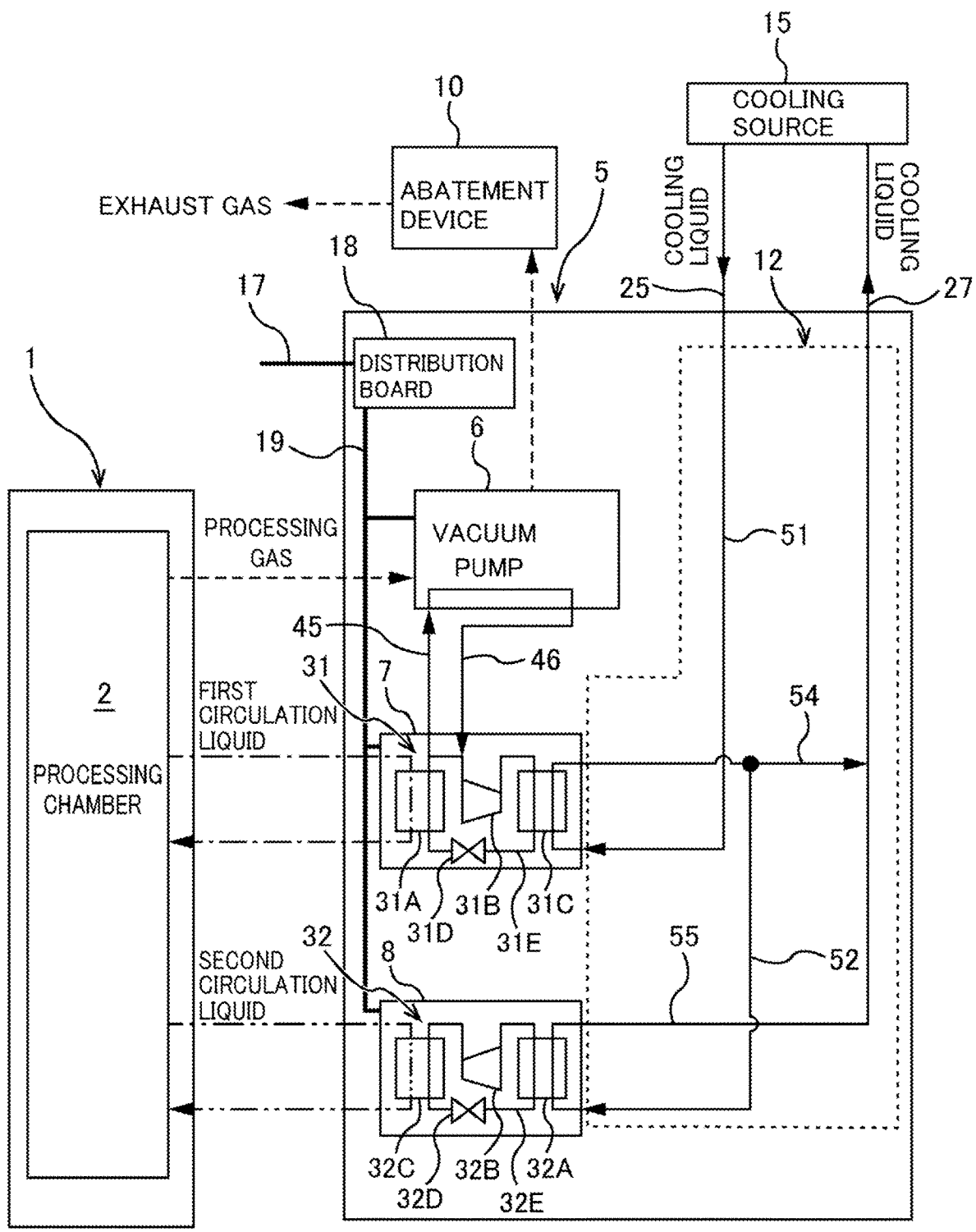
FIG. 5 is a schematic diagram showing still another embodiment of the sub-fab area installation apparatus.

FIG. 5 is a schematic diagram showing still another embodiment of the sub-fab area installation apparatus 5. Configurations and operations of the present embodiment, which will not be particularly described, are the same as those of the embodiments described with reference to FIG. 1, and duplicated descriptions thereof will be omitted. In this embodiment, the cooling liquid is not delivered to the vacuum pump 6, and instead, the refrigerant that has passed through the cooling unit 7 is supplied to the vacuum pump 6 as a cooling medium. More specifically, the sub-fab area installation apparatus 5 includes a refrigerant supply line 45 and a refrigerant return line 46 coupled to the first refrigerant pipe 31E of the first heat pump 31.

One end of the refrigerant supply line 45 is coupled to the first refrigerant pipe 31E at a position between the first evaporator 31A and the first compressor 31B of the first heat pump 31, and other end of the refrigerant supply line 45 is coupled to the vacuum pump 6. One end of the refrigerant return line 46 is coupled to the vacuum pump 6, and other end of the refrigerant return line 46 is coupled to the first refrigerant pipe 31E at a position between the first evaporator 31A and the first compressor 31B of the first heat pump 31.

In the present embodiment, the distribution line 21 and the merging return line 22 described with reference to FIG. 1 are not provided. Instead, the cooling-liquid line 12 has an upstream line 51 configured to supply the cooling liquid to the cooling unit 7, and a downstream line 52 configured to supply the cooling liquid that has passed through the cooling unit 7 to the heating unit 8. The upstream line 51 has cooling-liquid inlet 25, and the cooling-liquid inlet 25 communicates with the cooling source 15. The upstream line 51 is coupled to the first condenser 31C of the first heat pump 31. One end of the downstream line 52 is coupled to the first condenser 31C of the first heat pump 31, and other end of the downstream line 52 is coupled to the second evaporator 32A of the second heat pump 32.

The cooling-liquid line 12 further includes a first cooling-liquid return line 54 coupled to the cooling unit 7 and a second cooling-liquid return line 55 coupled to the heating unit 8. The first cooling-liquid return line 54 extends from the first condenser 31C of the first heat pump 31 to the cooling liquid outlet 27. The second cooling-liquid return line 55 extends from the second evaporator 32A of the second heat pump 32 to the cooling liquid outlet 27. The specific configuration of the first cooling-liquid return line 54 and the second cooling-liquid return line 55 is not particularly limited as long as their intended functions can be provided. For example, the first cooling-liquid return line 54 and the second cooling-liquid return line 55 may be merged into one line, or may be two independent lines. The downstream line 52 and the first cooling-liquid return line 54 may partially form a common line or may be two independent lines.

The cooling liquid supplied from the cooling source 15 flows through the cooling-liquid inlet 25 into the upstream line 51, and flows through the upstream line 51 to the cooling unit 7, so that the cooling liquid cools the cooling unit 7. Specifically, the cooling liquid flows through the first condenser 31C of the first heat pump 31 and exchanges heat with the refrigerant. A part of the cooling liquid that has passed through the first condenser 31C is returned to the cooling source 15 through the first cooling-liquid return line 54, and the rest of the cooling liquid flows through the downstream line 52 and is supplied to the heating unit 8 to heat the heating unit 8. Specifically, the cooling liquid flows through the second evaporator 32A of the second heat pump 32 and exchanges heat with the refrigerant.

A part of the refrigerant that has flowed out of the first evaporator 31A of the first heat pump 31 contained in the cooling unit 7 flows through the refrigerant supply line 45 and is delivered to the vacuum pump 6 to cool the vacuum pump 6. The refrigerant that has passed through the vacuum pump 6 flows through the refrigerant return line 46, joins the refrigerant in the first refrigerant pipe 31E, and is supplied to the first compressor 31B of the first heat pump 31.

According to this embodiment, since the vacuum pump 6 can be cooled by using the refrigerant of the cooling unit 7, it is not necessary to introduce the cooling liquid to the vacuum pump 6. As a result, the pipes for the cooling liquid can be simplified.

Figure 6:
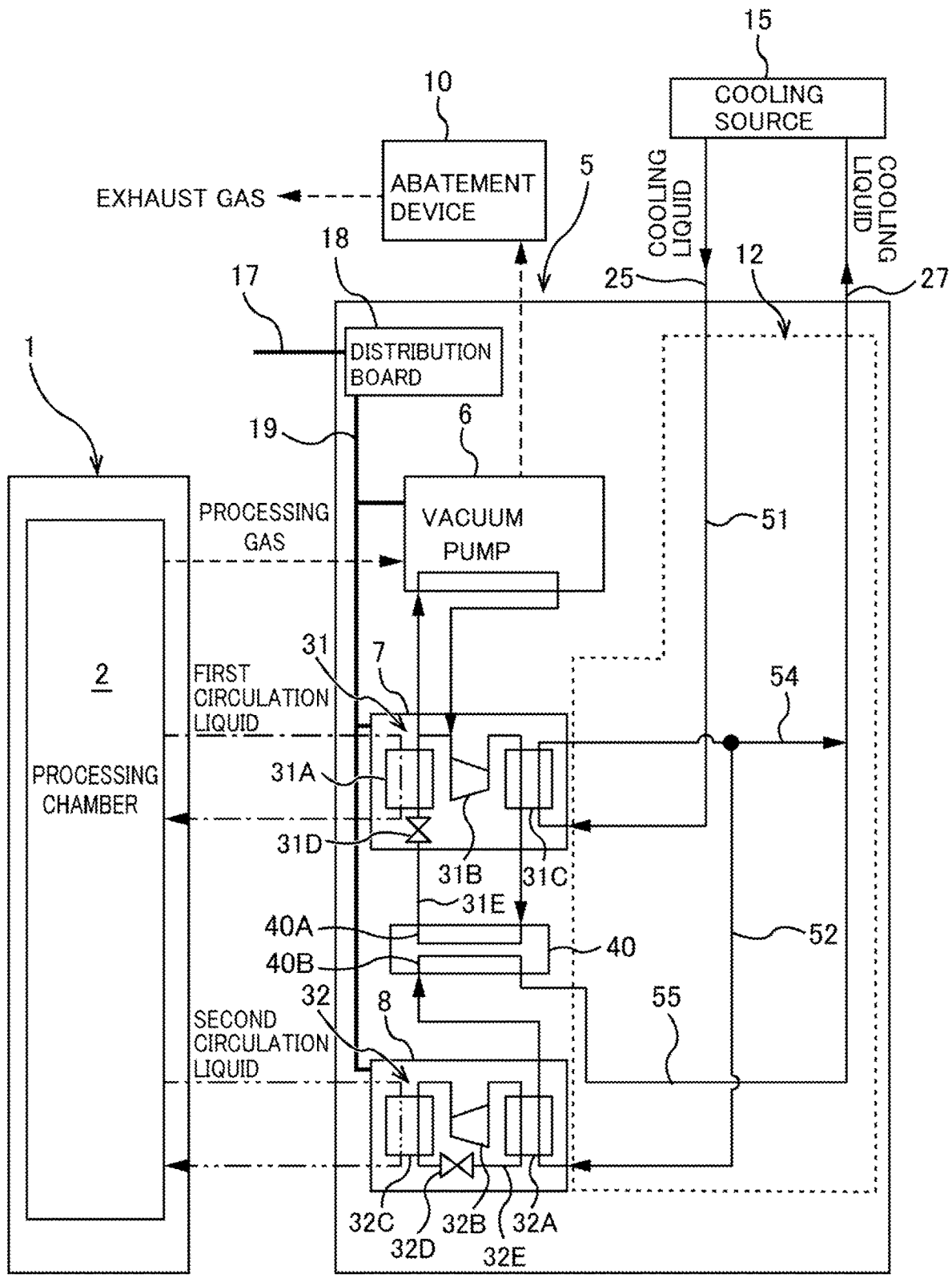
FIG. 6 is a schematic diagram showing still another embodiment of the sub-fab area installation apparatus.

As shown in FIG. 6, the supercooling device 40 described with reference to FIG. 2 may be incorporated into the embodiment described with reference to FIG. 5. Since the refrigerant is supercooled by the cooling liquid, the cooling efficiency of the cooling unit 7 can be improved.

Figure 7:
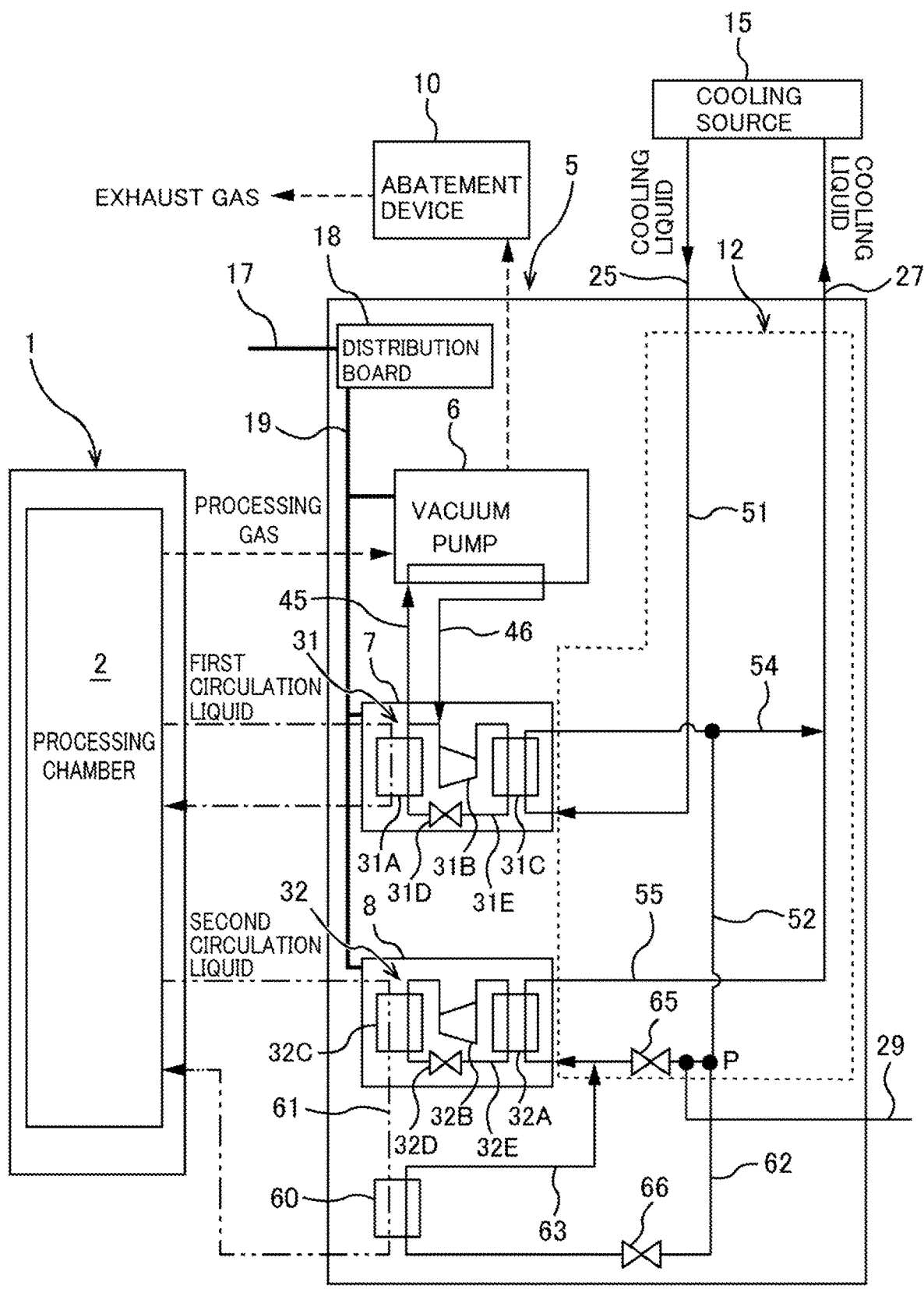
FIG. 7 is a schematic diagram showing still another embodiment of the sub-fab area installation apparatus.

FIG. 7 is a schematic diagram showing still another embodiment of the sub-fab area installation apparatus 5. Configurations and operations of the present embodiment, which will not be particularly described, are the same as those of the embodiments described with reference to FIG. 5, and duplicated descriptions thereof will be omitted. The sub-fab area installation apparatus 5 includes circulation-liquid cooler 60 configured to perform heat exchange between the second circulation liquid and the cooling liquid that has passed through the cooling unit 7. Further, the sub-fab area installation apparatus 5 includes circulation-liquid introduction line 61 extending from the second condenser 32C of the second heat pump 32 to the circulation-liquid cooler 60. The cooling-liquid line 12 further includes circulation-liquid cooling line 62 extending from the downstream line 52 to the circulation-liquid cooler 60, and a communication line 63 extending from the circulation-liquid cooler 60 to the downstream line 52. In one embodiment, the communication line 63 may be coupled to the second cooling-liquid return line 55 so that the cooling liquid is returned to the cooling source 15.

The cooling liquid flowing through the downstream line 52 flows through the circulation-liquid cooling line 62 into the circulation-liquid cooler 60, while the second circulation liquid that has passed through the second condenser 32C of the second heat pump 32 flows through the introduction line 61 into the circulation-liquid cooler 60. The cooling liquid and the second circulation liquid exchange heat in the circulation-liquid cooler 60, so that the second circulation liquid is cooled by the cooling liquid. The cooled second circulation liquid is returned to the processing chamber 2. According to the present embodiment, the second circulation liquid is cooled by the cooling liquid, and the temperature of the second circulation liquid when it is excessively heated by the heating unit 8 can be appropriately adjusted.

The sub-fab area installation apparatus 5 has first flow-rate control valve 65 attached to the downstream line 52 and second flow-rate control valve 66 attached to the circulation-liquid cooling line 62. The first flow-rate control valve 65 is located between the cooling unit 7 and a branch point P between the circulation-liquid cooling line 62 and the downstream line 52. The second flow-rate control valve 66 may be attached to the communication line 63.

A flow rate of the cooling liquid flowing through the circulation-liquid cooler 60 is determined by the operations of the first flow-rate control valve 65 and the second flow-rate control valve 66. Specifically, when an opening degree of the second flow-rate control valve 66 is lowered and an opening degree of the first flow-rate control valve 65 is increased, the flow rate of the cooling liquid flowing to the heating unit 8 increases, while the flow rate of the cooling liquid flowing to the circulation-liquid cooler 60 decreases. In one example, the opening degree of the second flow-rate control valve 66 is set to 0% (i.e., the second flow-rate control valve 66 is fully closed), and the opening degree of the first flow-rate control valve 65 is set to 100% (i.e., the first flow-rate control valve 65 is fully opened). In this case, the cooling liquid that has passed through the cooling unit 7 flows to the heating unit 8 and does not pass through the circulation-liquid cooler 60.

When the opening degree of the second flow-rate control valve 66 is increased and the opening degree of the first flow-rate control valve 65 is decreased, the flow rate of the cooling liquid flowing to the heating unit 8 decreases, while the flow rate of the cooling liquid flowing to the circulation-liquid cooler 60 increases. In one example, the opening degree of the second flow-rate control valve 66 is set to 100% (i.e., the second flow-rate control valve 66 is fully opened), and the opening degree of the first flow-rate control valve 65 is set to 0% (i.e., the first flow-rate control valve 65 is fully closed). In this case, the flow rate of the cooling liquid flowing through the circulation-liquid cooler 60 is maximized.

In this way, the flow rate of the cooling liquid passing through the circulation-liquid cooler 60 can be regulated by the balance between the opening degrees of the second flow-rate control valve 66 and the first flow rate control panel 65, so that the temperature of the second circulation liquid can be adjusted or regulated appropriately.

The sub-fab area installation apparatus 5 further includes external supply line 29 configured to supply, to the heating unit 8, a cooling liquid heated by an external heat source to have an increased temperature. Since the cooling liquid heated by the external heat source, such as an abatement device, has a higher temperature, the heating efficiency of the heating unit 8 can be improved by introducing such cooling liquid to the heating unit 8 through the external supply line 29. The external supply line 29 may be coupled to the downstream line 52. Further, in one embodiment, the external supply line 29 may be directly coupled to the heating unit 8.

Figure 8:
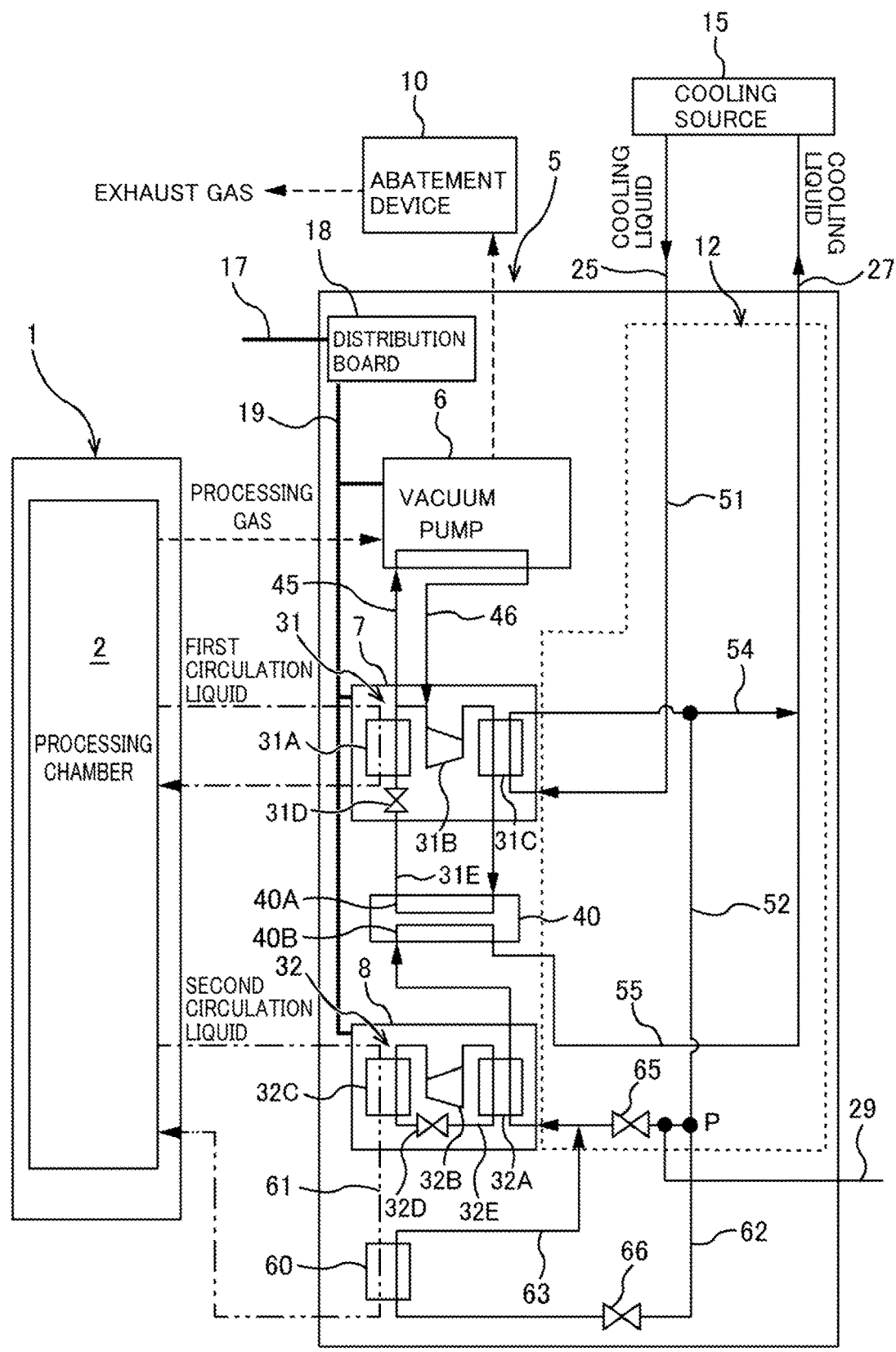
FIG. 8 is a schematic diagram showing still another embodiment of the sub-fab area installation apparatus.

As shown in FIG. 8, the supercooling device 40 described with reference to FIG. 6 may be incorporated into the embodiment described with reference to FIG. 7.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A sub-fab area installation apparatus used for a semiconductor manufacturing equipment, comprising:
   a vacuum pump configured to evacuate a processing gas from a processing chamber of the semiconductor manufacturing equipment;
   a cooling unit configured to cool a first circulation liquid used in the processing chamber;
   a heating unit configured to heat a second circulation liquid used in the processing chamber; and
   a cooling-liquid line configured to pass a cooling liquid therethrough, the cooling liquid being supplied from a cooling source,
   wherein the cooling unit includes a first heat pump through which a refrigerant circulates,
   the heating unit includes a second heat pump through which a refrigerant circulates, and
   the cooling-liquid line includes:
      a distribution line configured to supply the cooling liquid to the vacuum pump and the cooling unit; and
      a merging return line configured to merge the cooling liquid that has passed through the vacuum pump and the cooling unit and return the cooling liquid to the cooling source.

2. The sub-fab area installation apparatus according to claim 1, wherein the cooling-liquid line further includes a collecting line configured to supply the cooling liquid that has passed through the vacuum pump and the cooling unit to the heating unit.

3. The sub-fab area installation apparatus according to claim 1, further comprising a supercooling device configured to perform heat exchange between the cooling liquid that has passed through the heating unit and the refrigerant that flows from a condenser to an evaporator of the first heat pump.

4. The sub-fab area installation apparatus according to claim 2, further comprising a supercooling device configured to perform heat exchange between the cooling liquid that has passed through the heating unit and the refrigerant that flows from a condenser to an evaporator of the first heat pump.

5. The sub-fab area installation apparatus according to claim 2, further comprising a circulation-liquid cooler configured to perform heat exchange between the second circulation liquid and the cooling liquid flowing through the collecting line.

6. The sub-fab area installation apparatus according to claim 4, further comprising a circulation-liquid cooler configured to perform heat exchange between the second circulation liquid and the cooling liquid flowing through the collecting line.

7. The sub-fab area installation apparatus according to claim 5, wherein the cooling-liquid line further includes a communication line configured to deliver the cooling liquid that has passed through the circulation-liquid cooler to the collecting line.

8. The sub-fab area installation apparatus according to claim 6, wherein the cooling-liquid line further includes a communication line configured to deliver the cooling liquid that has passed through the circulation-liquid cooler to the collecting line.

9. The sub-fab area installation apparatus according to claim 1, further comprising an external supply line configured to supply a cooling liquid, heated by an external heat source, to the heating unit.

10. A sub-fab area installation apparatus used for a semiconductor manufacturing equipment, comprising:
    a vacuum pump configured to evacuate a processing gas from a processing chamber of the semiconductor manufacturing equipment;
    a cooling unit configured to cool a first circulation liquid used in the processing chamber;
    a heating unit configured to heat a second circulation liquid used in the processing chamber;
    a cooling-liquid line configured to pass a cooling liquid therethrough, the cooling liquid being supplied from a cooling source; and
    a refrigerant supply line,
    wherein the cooling unit includes a first heat pump through which a refrigerant circulates,
    the heating unit includes a second heat pump through which a refrigerant circulates, and
    the refrigerant supply line is configured to supply a part of the refrigerant, as a cooling medium, which has passed through an evaporator of the first heat pump to the vacuum pump, wherein the cooling-liquid line includes:
an upstream line configured to supply the cooling liquid to the cooling unit; and
a downstream line configured to supply the cooling liquid that has passed through the cooling unit to the heating unit.

11. The sub-fab area installation apparatus according to claim 10, further comprising a supercooling device configured to perform heat exchange between the cooling liquid that has passed through the heating unit and the refrigerant that flows from a condenser to an evaporator of the first heat pump.

12. The sub-fab area installation apparatus according to claim 10, further comprising a circulation-liquid cooler configured to perform heat exchange between the second circulation liquid and the cooling liquid that has passed through the cooling unit.

13. The sub-fab area installation apparatus according to claim 11, further comprising a circulation-liquid cooler configured to perform heat exchange between the second circulation liquid and the cooling liquid that has passed through the cooling unit.

14. The sub-fab area installation apparatus according to claim 12, wherein the cooling-liquid line further includes a communication line configured to deliver the cooling liquid that has passed through the circulation-liquid cooler to the downstream line.

15. The sub-fab area installation apparatus according to claim 13, wherein the cooling-liquid line further includes a communication line configured to deliver the cooling liquid that has passed through the circulation-liquid cooler to the downstream line.

16. A sub-fab area installation apparatus used for a semiconductor manufacturing equipment, comprising:
a vacuum pump configured to evacuate a processing gas from a processing chamber of the semiconductor manufacturing equipment;
a cooling unit configured to cool a first circulation liquid used in the processing chamber;
a heating unit configured to heat a second circulation liquid used in the processing chamber;
a cooling-liquid line configured to pass a cooling liquid therethrough, the cooling liquid being supplied from a cooling source; and
a refrigerant supply line,
wherein the cooling unit includes a first heat pump through which a refrigerant circulates,
the heating unit includes a second heat pump through which a refrigerant circulates, and
the refrigerant supply line is configured to supply a part of the refrigerant, as a cooling medium, which has passed through an evaporator of the first heat pump to the vacuum pump,
wherein the sub-fab area installation apparatus further comprises a supercooling device configured to perform heat exchange between the cooling liquid that has passed through the heating unit and the refrigerant that flows from a condenser to an evaporator of the first heat pump.

17. The sub-fab area installation apparatus according to claim 16, further comprising a circulation-liquid cooler configured to perform heat exchange between the second circulation liquid and the cooling liquid that has passed through the cooling unit.

18. A sub-fab area installation apparatus used for a semiconductor manufacturing equipment, comprising:
a vacuum pump configured to evacuate a processing gas from a processing chamber of the semiconductor manufacturing equipment;
a cooling unit configured to cool a first circulation liquid used in the processing chamber;
a heating unit configured to heat a second circulation liquid used in the processing chamber;
a cooling-liquid line configured to pass a cooling liquid therethrough, the cooling liquid being supplied from a cooling source,
a refrigerant supply line; and
an external supply line configured to supply a cooling liquid, heated by an external heat source, to the heating unit,
wherein the cooling unit includes a first heat pump through which a refrigerant circulates,
the heating unit includes a second heat pump through which a refrigerant circulates, and
the refrigerant supply line is configured to supply a part of the refrigerant, as a cooling medium, which has passed through an evaporator of the first heat pump to the vacuum pump.

* * * * *